(12) United States Patent
Kinmont et al.

(10) Patent No.: US 10,767,254 B2
(45) Date of Patent: Sep. 8, 2020

(54) NANOPARTICLE COATING APPARATUS

(71) Applicant: Nano Resources Limited, Stroud, Gloucestershire (GB)

(72) Inventors: Patrick William John Kinmont, Stroud (GB); Robert Davidson Binns, Stroud (GB); Christopher Robin Binns, Stroud (GB)

(73) Assignee: Nano Resources Limited, Stroud (GB)

( * ) Notice: Subject to any disclaimer, the term of this patent is extended or adjusted under 35 U.S.C. 154(b) by 0 days.

(21) Appl. No.: 15/514,450

(22) PCT Filed: Sep. 24, 2015

(86) PCT No.: PCT/GB2015/052774
§ 371 (c)(1),
(2) Date: Mar. 24, 2017

(87) PCT Pub. No.: WO2016/046561
PCT Pub. Date: Mar. 31, 2016

(65) Prior Publication Data
US 2017/0241010 A1    Aug. 24, 2017

(30) Foreign Application Priority Data
Sep. 26, 2014 (GB) .................................... 1417045

(51) Int. Cl.
*C23C 14/22* (2006.01)
(52) U.S. Cl.
CPC .......... *C23C 14/223* (2013.01); *C23C 14/228* (2013.01)

(58) Field of Classification Search
CPC .................................................. C23C 14/223
See application file for complete search history.

(56) References Cited

U.S. PATENT DOCUMENTS 4,356,429 A * 10/1982 Tang ...................... H05B 33/20
                                                           313/503
5,736,073 A *  4/1998 Wadley .................... B22F 9/12
                                                           264/10
(Continued)

FOREIGN PATENT DOCUMENTS

CN       1810629 A     8/2006
CN     101503792 A     8/2009
(Continued)

OTHER PUBLICATIONS

Tanaka_2002_Jpn._J._Appl._Phys._41_L1175 (Year: 2002).*
International Search Report and Written Opinion for PCT/GB2015/052774, dated Jan. 14, 2016, 8 pages.

*Primary Examiner* — Joseph A Miller, Jr.
(74) *Attorney, Agent, or Firm* — Craig J. Lervick; Larkin Hoffman Daly & Lindgren Ltd.

(57) ABSTRACT

The present invention provides an apparatus for forming a uniform, large scale nanoparticle coating on a substrate. The apparatus comprises a source of vaporised metal nanoparticles. The apparatus further comprises a first plate (20) providing an array of spaced apart first apertures (22). The apparatus further comprises a second plate (24) aligned with and spaced apart from the first plate (20). The second plate (24) provides an array of spaced apart second apertures 26. Each second aperture (26) of the second plate (24) is aligned with a first aperture (22) of the first plate (20).

3 Claims, 2 Drawing Sheets

(56) References Cited

U.S. PATENT DOCUMENTS

| | | | |
|---|---|---|---|
| 2004/0046130 A1* | 3/2004 | Rao | C04B 35/565 250/492.1 |
| 2005/0016461 A1* | 1/2005 | Klug | C23C 14/12 118/726 |
| 2006/0269690 A1* | 11/2006 | Watanabe | B82Y 30/00 427/569 |
| 2012/0024478 A1* | 2/2012 | Huang | B23P 15/16 156/345.34 |
| 2012/0164776 A1* | 6/2012 | Rathweg | C23C 14/0629 438/57 |
| 2013/0017367 A1* | 1/2013 | Ravagnan | C23C 14/22 428/144 |

FOREIGN PATENT DOCUMENTS

| | | | |
|---|---|---|---|
| EP | 1418250 | * | 9/2011 |
| GB | 2481860 A | | 1/2012 |
| WO | 2011121017 A1 | | 10/2011 |
| WO | 2014041377 A1 | | 3/2014 |

* cited by examiner

NANOPARTICLE COATING APPARATUS

The present invention relates to an apparatus and a method for producing a large scale, uniform metal nanoparticle coating on a substrate.

BACKGROUND TO THE INVENTION

Films composed of gas-phase nanoparticles have a wide range of applications in technology ranging from antimicrobial coatings to high magnetization films for magnetic data storage technology. A range of gas-phase nanoparticle sources have been built in research laboratories and are also commercially available.

Conventional gas-phase nanoparticle sources, such as for example the apparatus illustrated in FIG. 1, are only capable of forming deposits over a relatively small area (a few $cm^2$). However, many applications for nanoparticle coatings, such as for example write heads or wafer, require coatings to be applied uniformly over a large area.

There is therefore a need for an apparatus and a method for producing large scale metal nanoparticle coatings on a substrate. There is also a need for an apparatus and a method for producing large scale, substantially uniform, metal nanoparticle coatings on a substrate.

The present invention seeks to address the problems of the prior art.

SUMMARY OF THE INVENTION

According to a first aspect, the present invention provides an apparatus for forming a uniform, large scale nanoparticle coating on a substrate, in which the apparatus comprises:
 a source of vaporised metal nanoparticles;
 a first plate providing an array of spaced apart first apertures; and
 a second plate aligned with and spaced apart from the first plate, in which the second plate provides an array of spaced apart second apertures,
 in which each second aperture of the second plate is aligned with a first aperture of the first plate.

The apparatus preferably further comprises a plurality of lenses. Each lens may be associated with a respective first aperture of the first plate. For example, each lens may be aligned with a first aperture of the first plate. The lenses may be selected to focus nanoparticles having predetermined dimensions into the respective first aperture.

The lenses may be selected from any suitable lenses for focusing nanoparticles having the required predetermined dimensions into the respective first aperture. For example, one or more of the lenses may be aerodynamic lenses. By focusing the nanoparticles, the lenses enable the respective first apertures of the first plate to produce a first stream of nanoparticles having a narrow size distribution of nanoparticles centred on a predetermined nanoparticle dimension, for example diameter.

The apparatus may further comprise a plurality of skimmers. Each skimmer may be aligned with a respective second aperture of the second plate.

The first plate is preferably located within a first chamber. The second plate is preferably located within a second chamber. The first and second chambers are preferably separate chambers.

The apparatus may further comprise a plurality of shell evaporators for providing a coating of a shell material on the nanoparticles. Each shell evaporator preferably comprises an elongate heated tube providing an open channel extending therethrough, in which the channel extends substantially parallel to the longitudinal axis of the tube. The open channel of each tube is preferably aligned with a second aperture of the apparatus. Shell material is preferably located within the channel of each heated tube.

In accordance with a second aspect, the present invention provides a method of preparing a uniform, large scale nanoparticle coating on a substrate, in which the method comprises:
 providing a source of vaporised metal nanoparticles;
 passing the vaporised metal nanoparticle source through an array of first apertures provided by a first plate to provide a first stream of vaporised metal nanoparticles;
 passing the first stream of vaporised metal nanoparticles through an array of second apertures provided by a second plate to produce multiple second streams of free nanoparticles; and
 impinging a substrate with the multiple second streams of free nanoparticles to deposit a uniform, large scale nanoparticle coating on the substrate.

The method may further comprise differential pumping between the first and second plates to produce a stream of free nanoparticles prior to passing the first stream though the second apertures.

The method may further comprise focusing the source of vaporised metal nanoparticles prior to passing the source through the array of first apertures provided by the first plate.

The method may further comprise selecting a plurality of lenses for alignment with each of the respective first apertures. Each lens preferably has the appropriate internal dimensions for focusing nanoparticles having predetermined dimensions to pass through the first apertures.

The method may further comprises coating the nanoparticles with a shell material. The method may further comprise passing one or more of the multiple second streams of free nanoparticles through a respective shell evaporator prior to impinging the multiple second nanoparticle streams on a substrate.

BRIEF DESCRIPTION OF THE DRAWINGS

An embodiment of the invention will now be described, by way of example only, and with reference to the accompanying drawings, in which.

DETAILED DESCRIPTION OF THE INVENTION

Figure 1:
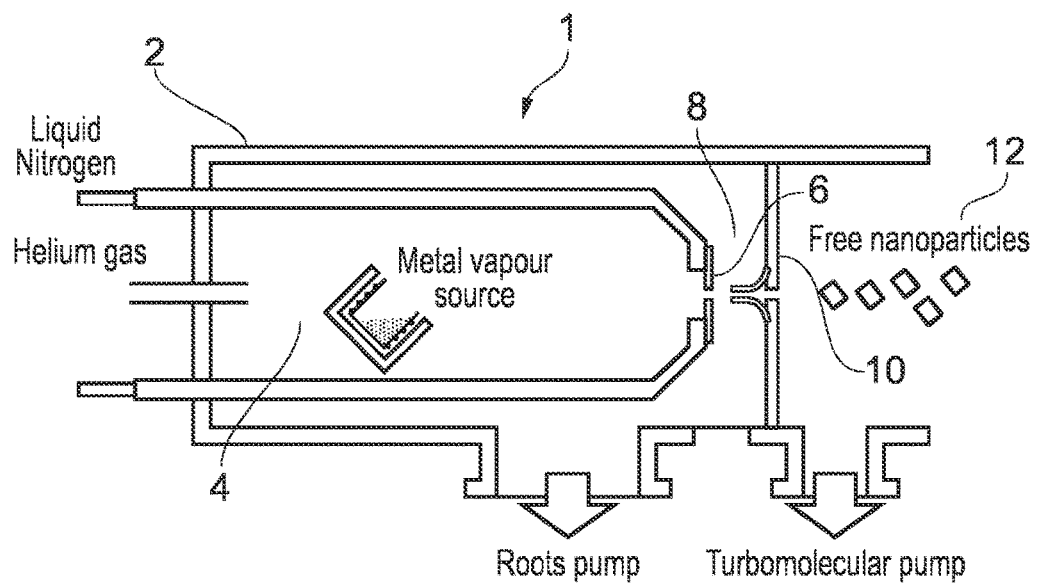
FIG. 1 illustrates a conventional apparatus for forming nanoparticle coatings on a substrate.

As shown in FIG. 1, the conventional apparatus 2 for forming nanoparticle coatings on a substrate comprises a nanoparticle gas aggregation source 4 that produces nanoparticles using thermal evaporation. The nanoparticle gas aggregation source 4 produces metal vapour with a flow of He at a few mbar pressure. The supersaturated metal vapour so formed condenses to provide metal nanoparticles.

The vaporised metal nanoparticles are then passed through a first aperture 6 to produce a first stream 8 of nanoparticles. This first stream 8 is then incident on a second aperture 10. The second aperture is often in the shape of a skimmer. Differential pumping may occur between the first 6 and second 10 apertures in order to remove the gas so that a stream of free nanoparticles emerges from the second aperture 10.

Figures 2, 3, 4:
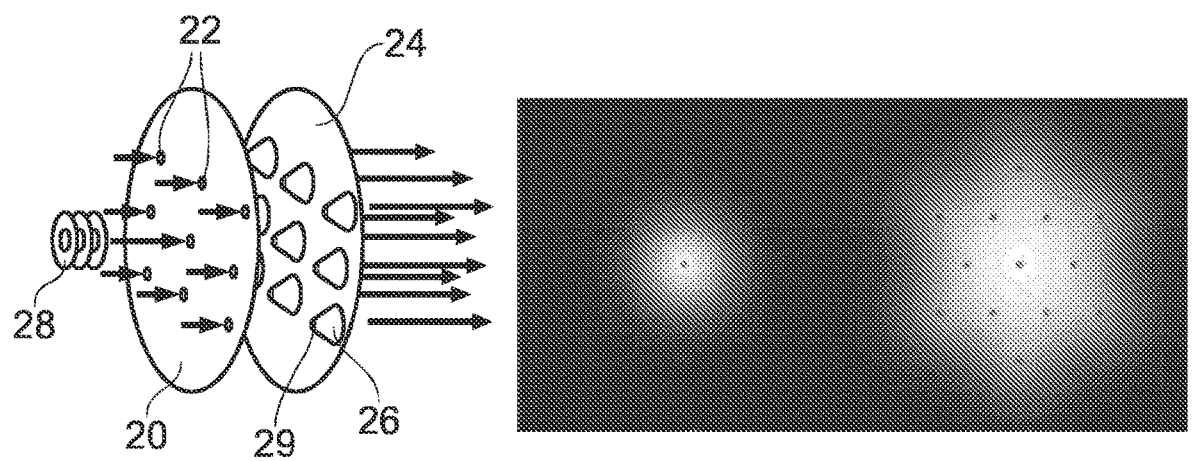
FIG. 2 illustrates apparatus according to a first embodiment of the present invention for forming uniform, large scale nanoparticle coatings on a substrate.
FIG. 3 illustrates a simulation of the nanoparticle deposit produced by the single point source of nanoparticles at a set distance from the conventional apparatus of FIG. 1.
FIG. 4 illustrates a simulation of the nanoparticle deposit produced by the multiple point source of nanoparticles at a set distance from the apparatus of FIG. 2.
Figure 5:
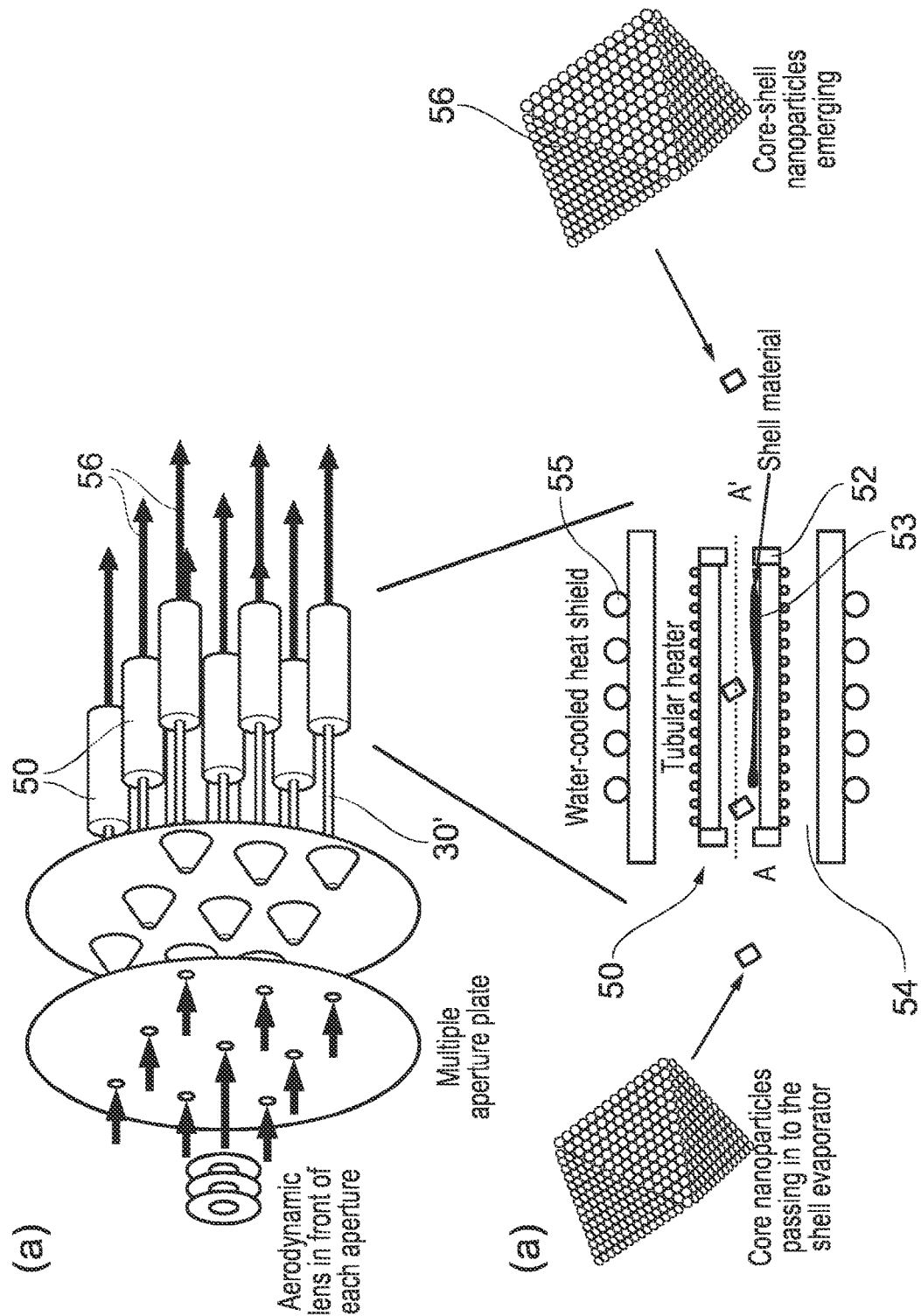
FIG. 5 illustrates apparatus according to a further embodiment of the present invention for forming uniform, large scale shell-coated nanoparticle coatings on a substrate.

As can be seen from FIG. 3, the conventional apparatus 2 provides a single point source 12 stream of free nanoparticles to provide a coating over a small region of the substrate. Typically the angle of divergence of the single point source stream 12 is approximately 17°. As a result, it is difficult to provide a coating of nanoparticles over a large area on a substrate. In order to do this, the substrate may need to be positioned a significant distance away from the second aperture 10 of the apparatus. Furthermore, it has been found that the thickness of the nanoparticle coating provided on a substrate varies depending on the distance of that portion of the substrate from the centre of the single point source stream 12. As a result, if the nanoparticle coating is required to be of a uniform thickness, the substrate will need to be positioned even further away from the second aperture in order to provide a uniform thickness coating over a central region of the substrate. In this case, only the central region of the substrate will have a coating having a substantially uniform thickness.

The present invention provides an apparatus and a method for forming a uniform, large scale nanoparticle coating on a substrate. As shown in FIG. 2, the apparatus comprises: a source of vaporised metal nanoparticles; a first plate 20 providing an array of spaced apart first apertures 22; and a second plate 24 aligned with and spaced apart from the first plate 20. The second plate 24 provides an array of spaced apart second apertures 26. Each second aperture 26 of the second plate 24 is aligned with a first aperture 22 of the first plate 20. A skimmers 29 is located adjacent each of the second apertures 26 shown in the apparatus.

The source of vaporised metal nanoparticles may be prepared by any conventional method. For example, the vaporized metal nanoparticles source may produce metal vapour with a flow of helium.

The term "nanoparticle" is used herein to refer to particles with dimensions in the range of between 1 nm and 100 nm.

The dimensions and shape of each of the first 20 and second 24 plates may vary depending on the requirements for the apparatus. The separation between the first 20 and second 24 plates may vary depending on the requirements for the emerging second stream of free nanoparticles. The separation between the second plate and the substrate to be coated may also vary depending on the requirements for the coating.

The apparatus shown in FIG. 2 comprises an array of first apertures 22 and an array of second apertures 26. Each array comprises 13 apertures. It is however to be understood that the array of first apertures 22 and the array of second apertures 26 may include any suitable number of apertures in any suitable configuration. Preferably, the number of first apertures 22 is the same as the number of second apertures 26. Preferably, the spacings between pairs of first apertures 22 and the configuration of the first apertures 22 is substantially the same as the spacings between respective pairs of second apertures 26 and the configuration of the second apertures 26. For example, the configuration of the array of first apertures 22 and the second apertures 26 may have any suitable shape, and may for example be selected from substantially circular, rectangular, square, ovaloid, cross-shaped, or any combination thereof.

The apparatus further comprises a plurality of lenses 28. Each lens 28 may be aligned with a first aperture 22 of the first plate 20. Each lens 28 is arranged to focus nanoparticles having a predetermined dimensions into a respective first aperture 22 of the first plate 20. The lens 28 may be any suitable lenses for focusing the nanoparticles having the desired predetermined dimensions to the first apertures 22. In the apparatus illustrated in FIG. 2, the lenses 28 are aerodynamic lenses.

The lenses are selected in order to provide a lens having the required internal dimensions for focusing the nanoparticles having the predetermined dimensions required to provide the coating. The size distribution of the resultant nanoparticles emerging from the apparatus may be varied by selecting different lenses having different internal dimensions.

The apparatus further comprises a plurality of skimmers 29. Each skimmer 29 is arranged to be aligned with, for example located adjacent to and to extend around, a second aperture 26. It is to be understood that the apparatus may not include skimmers.

Although it is not shown in FIG. 2, the first plate 20 may be located within a first chamber of the apparatus. The second plate 24 may be located within a separate chamber (for example, second chamber) of the apparatus.

In use, the desired aerodynamic lenses 28 having the required internal dimensions for focusing nanoparticles having predetermined dimensions are selected and positioned adjacent to each of the first apertures 22. A source of vaporized metal nanoparticles is produced (more details?). The vaporized metal nanoparticles having the required predetermined dimensions are focused by the aerodynamic lens 28 and pass through the first apertures 22 to produce multiple first streams of vaporized metal nanoparticles. Each of the first streams is channeled through a respective skimmer 29 positioned adjacent the respective second aperture 26 of the second plate 24 of the apparatus. A stream of free nanoparticles 30 having a narrow size distribution about a predetermined nanoparticle size emerge from the apparatus to impinge on a substrate (not shown). Examples of suitable substrates include, but are not limited to, wafers and write heads for hard disk storage systems FIG. 3 illustrates a simulation of a nanoparticle coating or deposit produced on a substrate positioned at a set distance from a single aperture apparatus (as shown in FIG. 1). FIG. 4 illustrates a simulation of a nanoparticle coating or deposit produced on a substrate positioned at the same distance away from the 13 aperture apparatus as shown in FIG. 2. It can be seen from these Figures that the present invention provides a uniform coating of nanoparticles over a significantly greater area than the single aperture apparatus of FIG. 1. The apparatus of the present invention is easily scaleable to coat a required area of a substrate having any shape and/or dimensions. It is to be understood that for any given distance between the substrate and the apparatus, the number and/or configuration of apertures provided by the apparatus can be optimized.

As shown in FIG. 5, the apparatus may include a plurality of shell evaporators 50. Each shell evaporator 50 is aligned with a respective second aperture 26' of the second plate 24' of the apparatus. Each shell evaporator 50 comprises an elongate heated tube 52 defining a longitudinal axis A-A'. Each heated tube 52 provides an open channel 54 extending therethrough, and substantially aligned with the longitudinal axis of the tube 52. Each heated tube 52 is surrounded by a water-cooled heat shield 55 so that the rest of the apparatus is not heated by the tubes 52. Shell coating material 53 is located within the channel 54 of each tube 52. Any suitable shell coating material may be used.

In use, each stream of free nanoparticles 30' passes through a shell evaporator 50. A local high vapour pressure of the shell material is produced around each nanoparticle stream 30' so that the method allows very efficient use of shell materials. The differential pressure in the nanoparticle stream prevents the shell material moving upstream from the tube into the nanoparticle source. A stream of free shell material coated nanoparticles 56 emerge from each shell evaporator 50 prior to impinging with a substrate for coating.

The present invention may be used specifically to provide nanoparticle coatings on write heads for hard disk storage systems. In particular, the present invention may provide an apparatus and method for providing a substantially uniform layer of FeCo alloy on a wafer of a write head such that each write head has a high magnetization tip to maximize the magnetic field available for writing data onto the disk. It is known that Co nanoparticles embedded in Fe matrices produce films with a higher magnetization than FeCo alloys. The present invention therefore provides an apparatus and a method for providing a uniform, large scale coating of Co on a substrate, for example a wafer, comprising a Fe matrix.

Although aspects of the invention have been described with reference to the embodiment shown in the accompanying drawings, it is to be understood that the invention is not limited to the precise embodiment shown and that various changes and modifications may be effected without further inventive skill and effort.

The invention claimed is:

1. An apparatus for forming a uniform, large scale nanoparticle coating on a substrate, in which the apparatus comprises:

a source of vaporized metal nanoparticles;

a first plate providing an array of spaced apart first apertures each apertures receiving vaporized metal nanoparticles;

a second plate aligned with and spaced apart from the first plate, in which the second plate provides an array of spaced apart second apertures, in which each second aperture of the second plate is aligned with a first aperture of the first plate thereby producing a stream of free nanoparticles for use in forming the uniform, large scale nanoparticle coating, where the apparatus is configured to cause differential pumping between the first and second plates to produce the stream of free nanoparticles; and a plurality of shell evaporators aligned with respective second apertures of the second plate.

2. The apparatus of claim 1, further comprising a plurality of lenses, in which each lens is associated with a corresponding one of the first apertures of the first plate.

3. The apparatus of claim 2, in which one or more of the lenses are aerodynamic lenses.

* * * * *